(12) United States Patent
Lin

(10) Patent No.: US 12,543,421 B2
(45) Date of Patent: Feb. 3, 2026

(54) DISPLAY DEVICE AND MANUFACTURING METHOD THEREOF

(71) Applicant: AUO Corporation, Hsinchu (TW)

(72) Inventor: Shih-Hsiung Lin, Hsinchu (TW)

(73) Assignee: AUO Corporation, Hsinchu (TW)

(*) Notice: Subject to any disclaimer, the term of this patent is extended or adjusted under 35 U.S.C. 154(b) by 489 days.

(21) Appl. No.: 18/088,632

(22) Filed: Dec. 26, 2022

(65) Prior Publication Data

US 2024/0178356 A1    May 30, 2024

(30) Foreign Application Priority Data

Nov. 29, 2022   (CN) .......................... 202211511712.0

(51) Int. Cl.
| | |
|---|---|
| *H10H 20/857* | (2025.01) |
| *C09J 9/02* | (2006.01) |
| *C09J 11/04* | (2006.01) |
| *H10H 20/01* | (2025.01) |

(52) U.S. Cl.
CPC .............. *H10H 20/857* (2025.01); *C09J 9/02* (2013.01); *C09J 11/04* (2013.01); *H10H 20/01* (2025.01); *C09J 2203/326* (2013.01); *C09J 2301/314* (2020.08); *C09J 2301/408* (2020.08); *C09J 2301/416* (2020.08); *H10H 20/0364* (2025.01)

(58) Field of Classification Search
CPC .. H10H 20/857; H10H 20/01; H10H 20/0364; C09J 9/02; C09J 11/04; C09J 2203/326; C09J 2301/314; C09J 2301/408; C09J 2301/416; C09J 2203/318; C09J 5/00; H01L 25/0753; H01L 24/29; H01L 24/83; H01L 2224/29198
See application file for complete search history.

(56) References Cited

U.S. PATENT DOCUMENTS

| | | | |
|---|---|---|---|
| 2006/0103000 A1 | 5/2006 | Kurosawa | |
| 2008/0265265 A1 | 10/2008 | Xiong et al. | |
| 2016/0366774 A1* | 12/2016 | Hasegawa | H10F 39/811 |
| 2017/0141261 A1* | 5/2017 | Zheng | H10H 20/0137 |
| 2017/0194526 A1* | 7/2017 | Rehder | B32B 7/04 |
| 2018/0040774 A1 | 2/2018 | Lee et al. | |
| 2018/0277591 A1* | 9/2018 | Wu | H10H 20/831 |

(Continued)

FOREIGN PATENT DOCUMENTS

| | | |
|---|---|---|
| CN | 205609523 | 9/2016 |
| CN | 111463229 | 7/2020 |

(Continued)

*Primary Examiner* — Ratisha Mehta
(74) *Attorney, Agent, or Firm* — JCIPRNET

(57) ABSTRACT

A display device including a circuit substrate, a first light-emitting diode, an anisotropic conductive adhesive structure, and a conductive connection element is provided. The first light-emitting diode is located above the circuit substrate. The anisotropic conductive adhesive structure is located between the circuit substrate and the first light-emitting diode, and electrically connects the circuit substrate to a lower electrode of the first light-emitting diode. The conductive connection element electrically connects the upper electrode of the first light-emitting diode to the circuit substrate. A portion of the conductive connection element is located on the anisotropic conductive adhesive structure.

18 Claims, 18 Drawing Sheets

(56) References Cited

U.S. PATENT DOCUMENTS

| | | | |
|---|---|---|---|
| 2019/0244937 A1* | 8/2019 | Honjo | G09F 9/00 |
| 2020/0052161 A1* | 2/2020 | Wu | H10H 20/8316 |
| 2020/0133148 A1* | 4/2020 | Ikezue | G03G 5/14726 |
| 2021/0118856 A1 | 4/2021 | Wu et al. | |
| 2022/0045123 A1 | 2/2022 | Yang | |
| 2023/0030752 A1 | 2/2023 | Chen et al. | |

FOREIGN PATENT DOCUMENTS

| | | |
|---|---|---|
| CN | 112768590 | 5/2021 |
| CN | 113471241 | 10/2021 |
| CN | 114068503 | 2/2022 |
| CN | 114361319 | 4/2022 |
| CN | 114613801 | 6/2022 |
| CN | 217306499 | 8/2022 |
| DE | 102013201926 | 8/2014 |
| KR | 20160028436 | 3/2016 |
| KR | 20220114967 | 8/2022 |
| TW | 201418407 | 5/2014 |
| WO | 2012093548 | 7/2012 |

\* cited by examiner

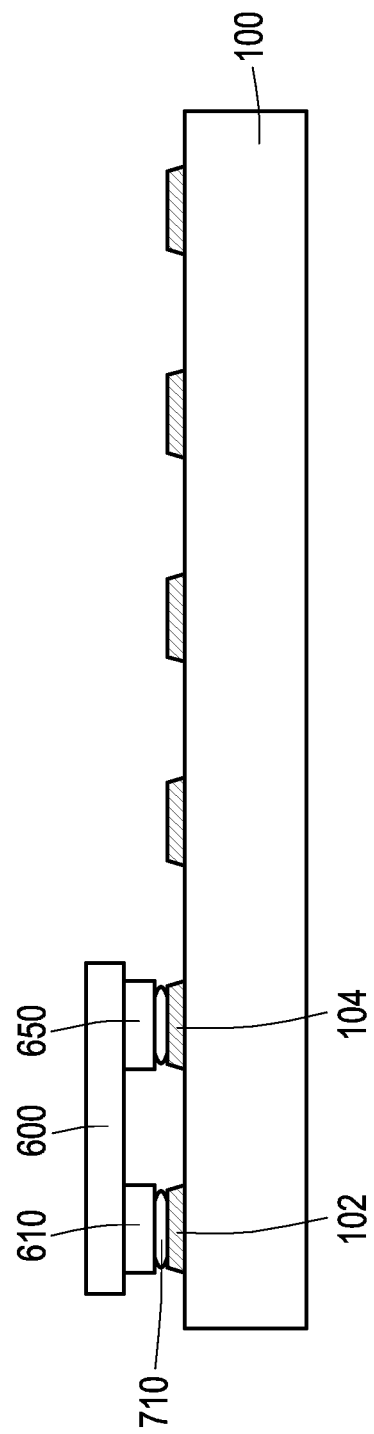

DISPLAY DEVICE AND MANUFACTURING METHOD THEREOF

CROSS-REFERENCE TO RELATED APPLICATION

This application claims the priority benefit of Chinese application no. 202211511712.0, filed on Nov. 29, 2022. The entirety of the above-mentioned patent application is hereby incorporated by reference herein and made a part of this specification.

BACKGROUND

Technical Field

The disclosure relates to a display device and a manufacturing method thereof.

Description of Related Art

A light-emitting diode (LED) is an electroluminescent semiconductor element, and has high efficiency, long service lifespan, non-likely breakage, fast response speed, high reliability, etc. Generally, technology for manufacturing a micro LED display lies in how to transfer a large number of micro LEDs onto a pixel array substrate. The micro LEDs are typically electrically connected to the pixel array substrate through solder. However, the micro LEDs fixed by solder are likely to fall off due to heat or impact during subsequent processes (for example, a conductive connection process), leading to failure in normal operation of the micro LEDs.

SUMMARY

The disclosure is directed to a display device and a manufacturing method thereof, which are adapted to reduce probability of falling-off of light-emitting diodes and reduce manufacturing difficulty of a conductive connection element.

At least one embodiment of the disclosure provides a display device including a circuit substrate, a first light-emitting diode, an anisotropic conductive adhesive structure, and a conductive connection element. The first light-emitting diode is located above the circuit substrate. The anisotropic conductive adhesive structure is located between the circuit substrate and the first light-emitting diode, and electrically connects the circuit substrate to a lower electrode of the first light-emitting diode. Taking a top surface of the circuit substrate as reference, a height of a top surface of the anisotropic conductive adhesive structure is greater than or equal to a height of a top surface of a light-emitting layer of the first light-emitting diode, and the height of the top surface of the anisotropic conductive adhesive structure is lower than a height of an upper electrode of the first light-emitting diode. The conductive connection element electrically connects the upper electrode of the first light-emitting diode to the circuit substrate. A portion of the conductive connection element is located on the anisotropic conductive adhesive structure.

At least one embodiment of the disclosure provides a manufacturing method of a display device, which includes the following. An anisotropic conductive adhesive structure is placed above a circuit substrate. A first light-emitting diode is disposed above the circuit substrate. The anisotropic conductive adhesive structure is located between the circuit substrate and the first light-emitting diode. The first light-emitting diode is pressurized so that the first light-emitting diode is trapped into the anisotropic conductive adhesive structure. Taking a top surface of the circuit substrate as reference, a height of a top surface of the anisotropic conductive adhesive structure is greater than or equal to a height of a top surface of a light-emitting layer of the first light-emitting diode, and the height of the top surface of the anisotropic conductive adhesive structure is lower than a height of an upper electrode of the first light-emitting diode. The anisotropic conductive adhesive structure electrically connects the circuit substrate to a lower electrode of the first light-emitting diode. A conductive connection element is formed on the upper electrode of the first light-emitting diode, the anisotropic conductive adhesive structure, and the circuit substrate. The conductive connection element electrically connects the upper electrode of the first light-emitting diode to the circuit substrate.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 2A to FIG. 2G are schematic cross-sectional views of a manufacturing method of a display device according to an embodiment of the disclosure.

DESCRIPTION OF THE EMBODIMENTS

Figure 1A:
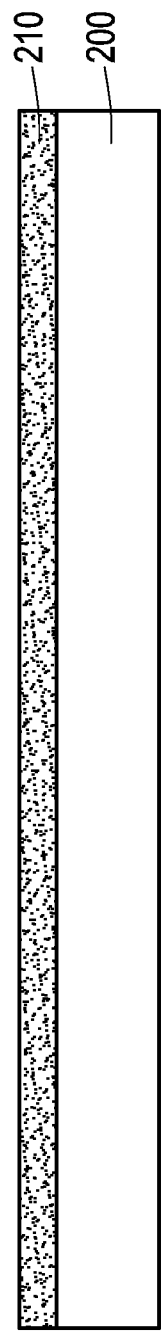
FIG. 1A to FIG. 1G are schematic cross-sectional views of a manufacturing method of a display device according to an embodiment of the disclosure.
Figure 1B:
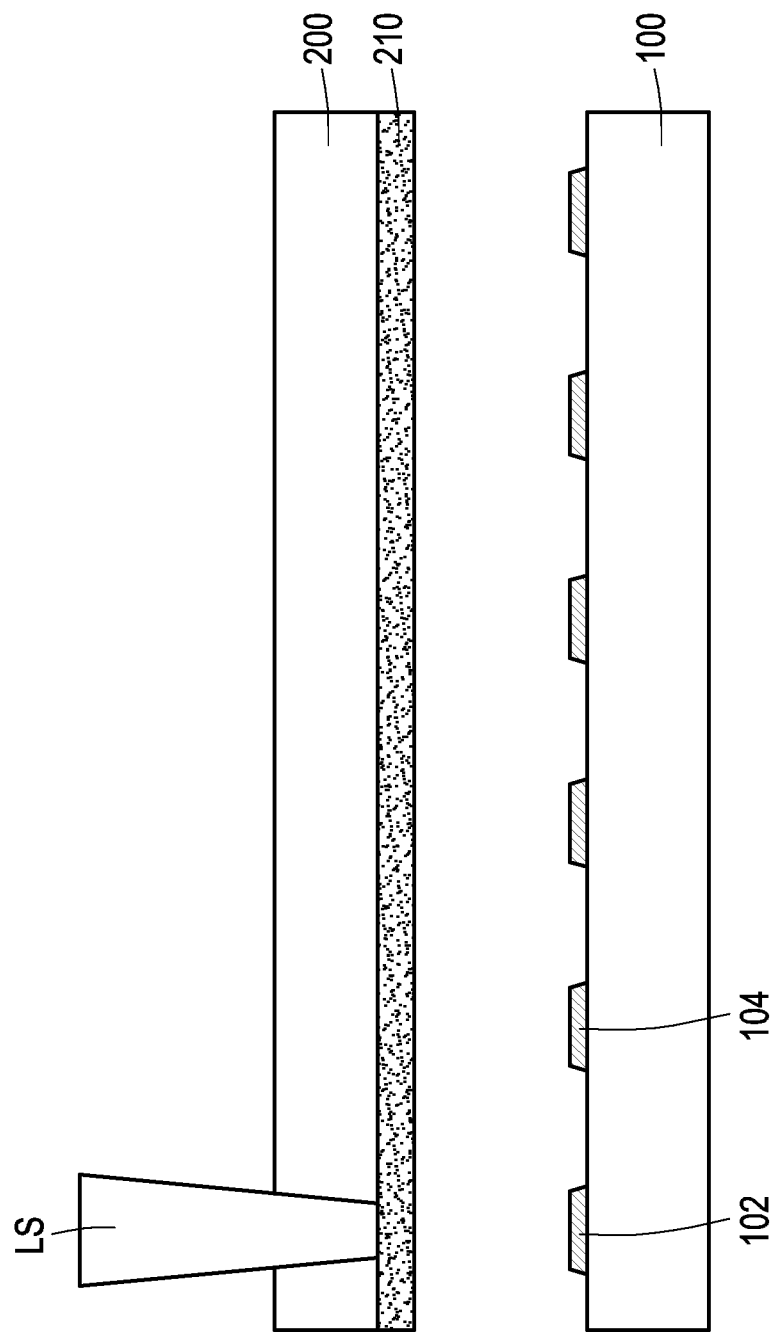
Figure 1C:
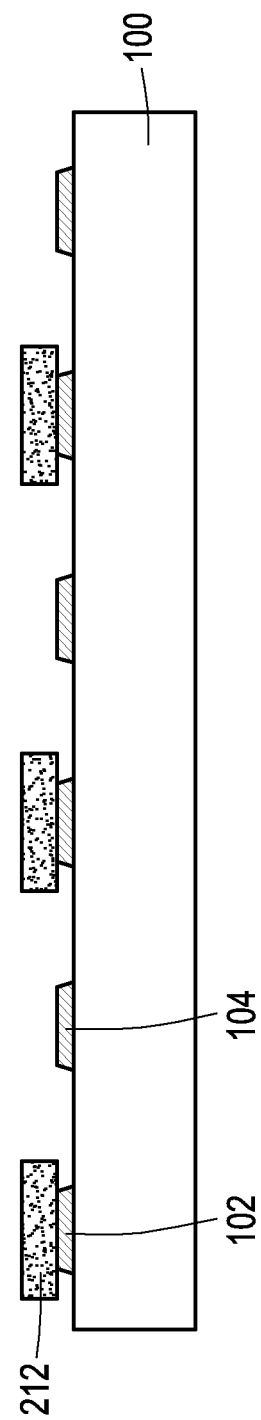

FIG. 1A to FIG. 1G are schematic cross-sectional views of a manufacturing method of a display device according to an embodiment of the disclosure. Referring to FIG. 1A to FIG. 1C, a plurality of anisotropic conductive adhesive structures 212 separated from each other are placed on a circuit substrate 100. For example, an anisotropic conductive adhesive material layer 210 is first attached to an entire surface of a carrier board 200, as shown in FIG. 1A. Then, referring to FIG. 1B, the carrier board 200 and the anisotropic conductive adhesive material layer 210 are moved to the above of the circuit substrate 100, and laser LS is used to irradiate a portion of the anisotropic conductive adhesive material layer 210. After irradiating the laser LS, a portion of the anisotropic conductive adhesive material layer 210 is transferred onto the circuit substrate 100 to form the anisotropic conductive adhesive structures 212, as shown in FIG. 1B to FIG. 1C. In the embodiment, the laser LS is used to control a size and a shape of the anisotropic conductive adhesive structures 212 to be transferred onto the circuit substrate 100, and after the anisotropic conductive adhesive structures 212 are transferred onto the circuit substrate 100, a portion of the anisotropic conductive adhesive material layer 210 still remains on the carrier board 200.

In some embodiments, the anisotropic conductive adhesive structures 212 are transparent. In other embodiments, the anisotropic conductive adhesive structures 212 may be gray or black by adding a carbon black material. When the anisotropic conductive adhesive structures 212 are added with the carbon black material, the anisotropic conductive adhesive structures 212 may be used as an anti-reflection layer to reduce reflectivity of a display area of the display device.

In the embodiment, a surface of the circuit substrate 100 includes a plurality of first pads 102 and a plurality of second pads 104. The interior of the circuit substrate 100 further includes other circuit structures (not shown), and a layout of the circuit structures may be adjusted according to requirements. In the embodiment, a corresponding anisotropic conductive adhesive structure 212 is disposed on each of the first pads 102.

Figure 1D:
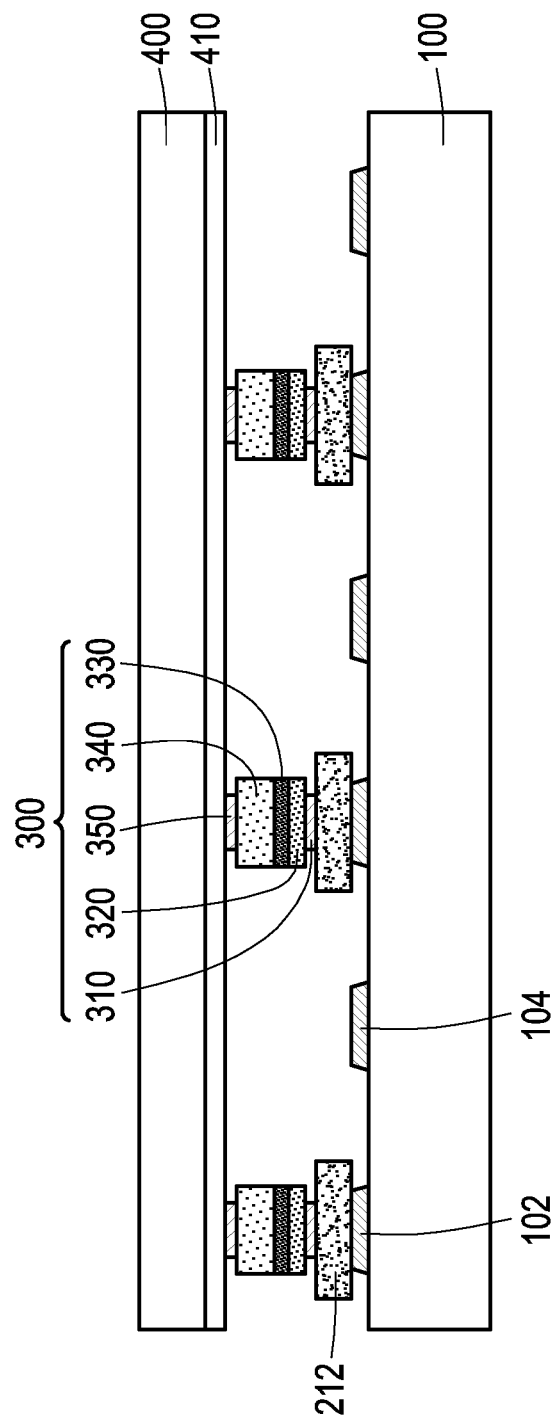

Then, referring to FIG. 1D, a plurality of first light-emitting diodes (LEDs) 300 are disposed above the circuit substrate 100, where the anisotropic conductive adhesive structures 212 are located between the circuit substrate 100 and the first LEDs 300.

For example, the plurality of first LEDs 300 are first formed on a growth substrate (not shown). In the embodiment, the first LEDs 300 are vertical LEDs, and each first LED 300 includes a lower electrode 310, a first semiconductor layer 320, a light-emitting layer 330, a second semiconductor layers 340 and an upper electrode 350 stacked in sequence, where one of the first semiconductor layer 320 and the second semiconductor layer 340 is an N-type semiconductor, and the other one is a P-type semiconductor.

Then, the first LEDs 300 on the growth substrate are transferred onto a transfer substrate 400. For example, the first LEDs 300 are adhered on an adhesive layer 410 of the transfer substrate 400.

Then, the transfer substrate 400 is used to transfer the first LEDs 300 onto the circuit substrate 100, and the anisotropic conductive adhesive structures 212 are adhered to the first LEDs 300. An adhesive force between the first LEDs 300 and the anisotropic conductive adhesive structures 212 is greater than an adhesive force between the first LEDs 300 and the adhesive layer 410. Therefore, after the transfer substrate 400 is removed, the first LEDs 300 may remain on the anisotropic conductive adhesive structures 212, where each anisotropic conductive adhesive structure 212 is located between the circuit substrate 100 and the corresponding first LED 300.

Figure 1E:
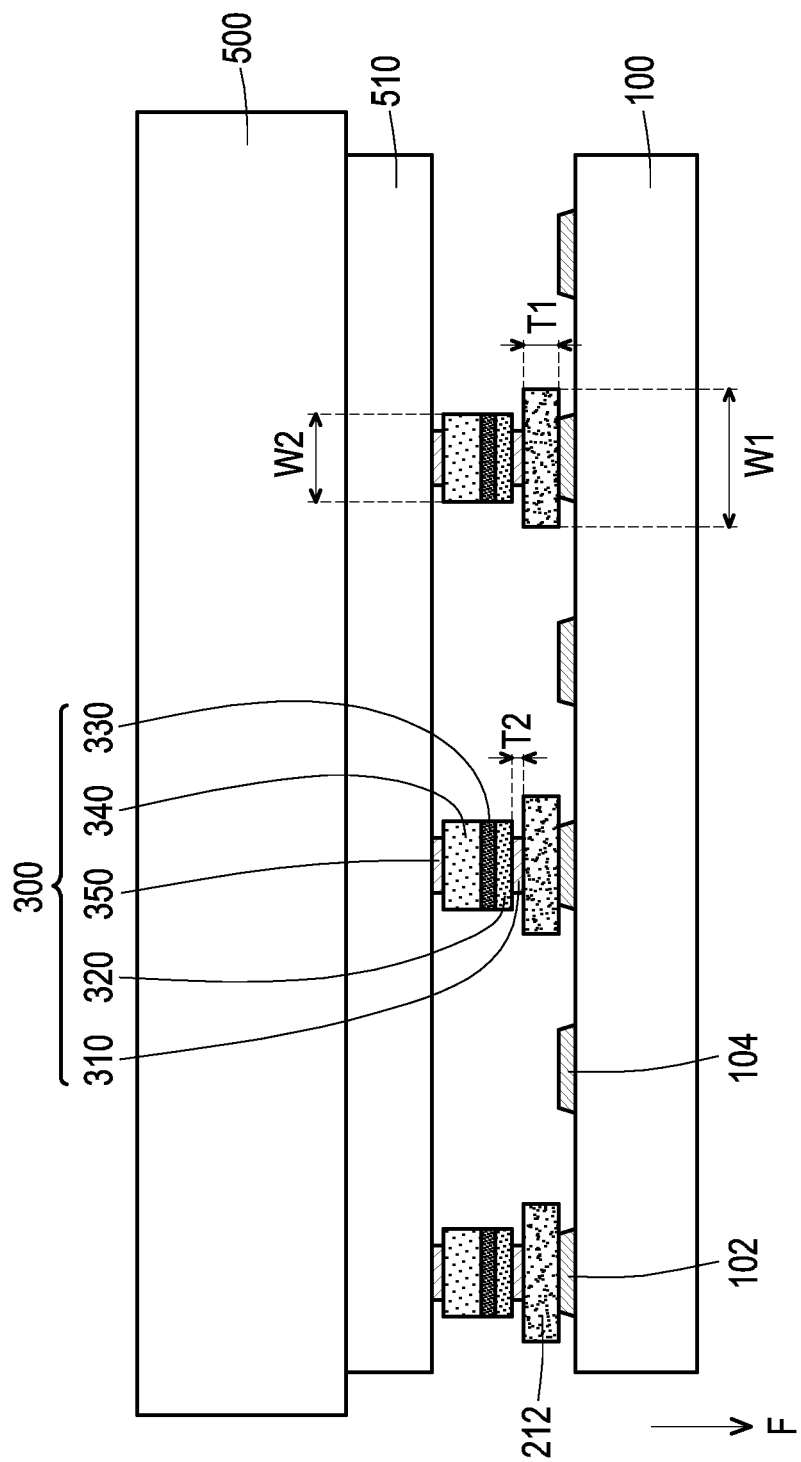
Figure 1F:
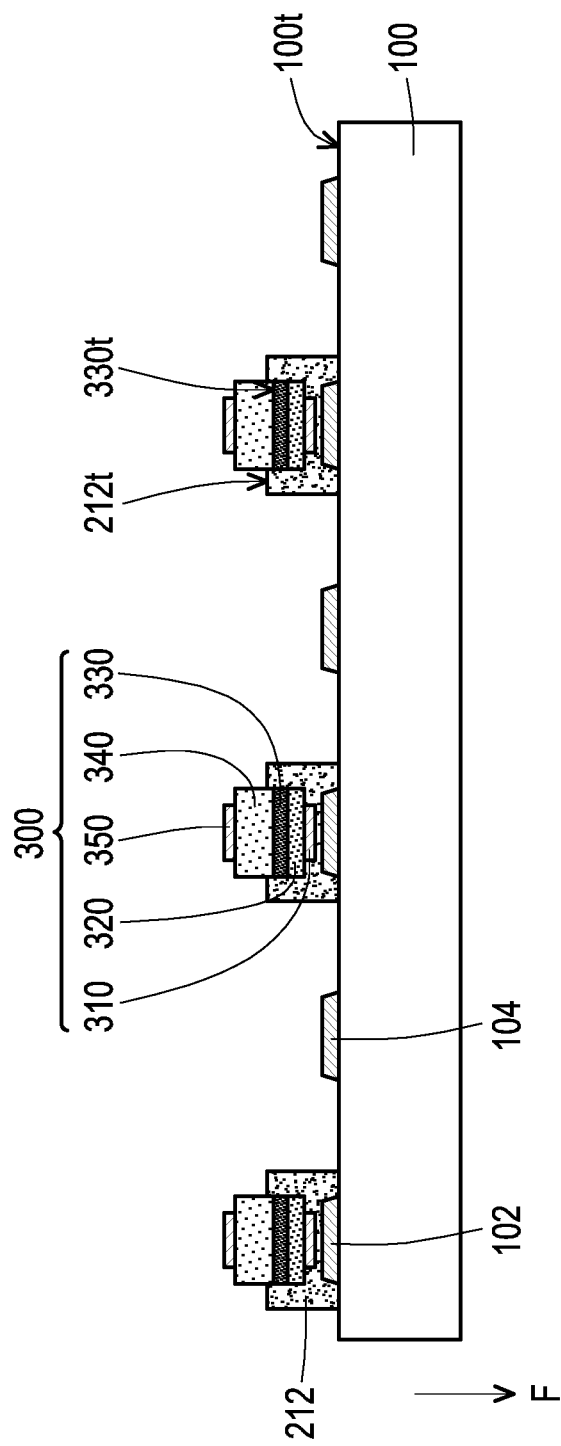

Then, referring to FIG. 1E to FIG. 1F, the first LEDs 300 are pressurized so that the first LEDs 300 are trapped into the anisotropic conductive adhesive structures 212. For example, a pressurizing member 500 is used to pressurize the plurality of first LEDs 300 at the same time. In some embodiments, a surface of the pressurizing member 500 includes a buffer layer 510, and the buffer layer 510 contacts the plurality of first LEDs 300 at the same time.

After the first LEDs 300 are pressurized, taking a top surface 100t of the circuit substrate 100a as reference, a height of a top surface 212t of the anisotropic conductive adhesive structure 212 is greater than or equal to a height of a top surface 330t of the light-emitting layer 330 of the first LED 300, and the height of the top surface 212t of the anisotropic conductive adhesive structure 212 is lower than a height of the upper electrode 350 of the first LED 300. Therefore, the anisotropic conductive adhesive structure 212 covers a sidewall of the lower electrode 310, a sidewall of the first semiconductor layer 320 and a sidewall of the light-emitting layer 330. Based on the above description, a short circuit between a subsequently formed conductive connection member and the lower electrode 310 or the first semiconductor layer 320 may be avoided.

In some embodiments, by adjusting a thickness T1 and a width W1 of the anisotropic conductive adhesive structure 212 before pressurization (referring to FIG. 1E), the anisotropic conductive adhesive structure 212 may wrap the lower electrode 310, the first semiconductor layer 320 and the light-emitting layer 330 after pressurization. For example, in some embodiments, the thickness T1 of the anisotropic conductive adhesive structure 212 before pressurization is greater than a thickness T2 of the lower electrode 310 of the first LED 300. In some embodiments, the width W1 of the anisotropic conductive adhesive structure 212 is greater than a width W2 of the first LED 300.

After the first LED 300 is pressurized, the anisotropic conductive adhesive structure 212 electrically connects the first pad 102 of the circuit substrate 100 to the lower electrode 310 of the first LED 300. In the embodiment, after the pressurization, the anisotropic conductive adhesive structure 212 may conduct electricity in a direction F of the pressurization, such as the direction F perpendicular to the top surface 100t of the circuit substrate 100 in FIG. 1F.

In the embodiment, to use the anisotropic conductive adhesive structures 212 to bond the first LEDs 300 to the circuit substrate 100 may reduce the probability of falling-off of the first LEDs 300.

In some embodiment, while the first LEDs 300 are pressurized, the anisotropic conductive adhesive structures 212 are heated to cure the anisotropic conductive adhesive structures 212, in some embodiments, the anisotropic conductive adhesive structures 212 are heated to a temperature of 100° C. to 180° C. to cure the anisotropic conductive adhesive structures 212.

Figure 1G:
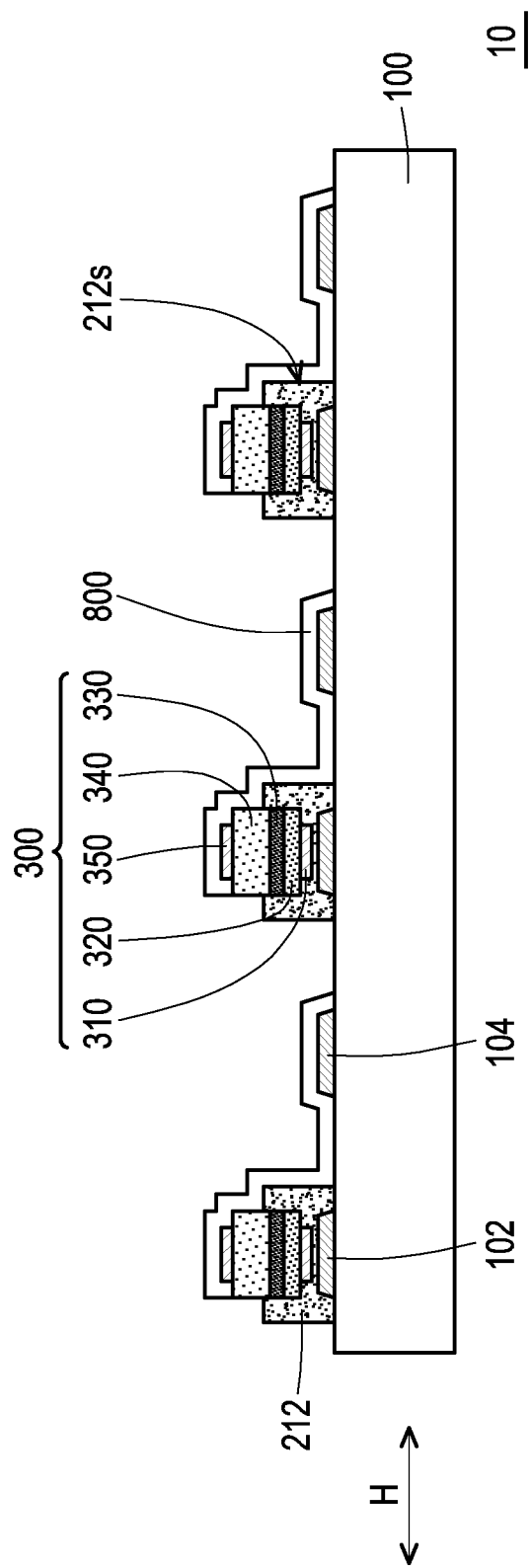

Finally, referring to FIG. 1G, a plurality of conductive connection elements 800 are formed on the upper electrode 350 of the first LEDs 300, the anisotropic conductive adhesive structures 212 and the second pads 104 of the circuit substrate 100. A portion of the conductive connection element 800 is located on the anisotropic conductive adhesive structure 212. The conductive connection element 800 electrically connects the upper electrode 350 of the first LED 300 to the second pad 104 of the circuit substrate 100. The conductive connection element 800 is in contact with the upper electrode 350, the second semiconductor layer 340, the conductive connection element 800, and the second pad 104, and a portion of the anisotropic conductive adhesive structure 212 is sandwiched between the conductive connection element 800 and the light-emitting layer 330, between the conductive connection element 800 and the first semiconductor layer 320, between the conductive connection element 800 and the lower electrode 310, and between the conductive connecting element 800 and the first pad 102. In some embodiments, the conductive connection element 800 includes metal, metal oxide (for example, indium tin oxide), metal nitride, or other suitable materials. In the embodiment, since the anisotropic conductive adhesive structure 212 does not conduct electricity in a horizontal direction H, even if the conductive connection element 800 contacts a sidewall 212s of the anisotropic conductive adhesive structure 212, the conductive connection element 800 will not be short-circuited with the first semiconductor layer 320 or the first pad 102.

In the embodiment, the anisotropic conductive adhesive structure 212 may be used as a step to prevent the conductive connection element 800 from breaking due to an excessive step difference between the upper electrode 350 and the second pad 104, thereby reducing the manufacturing difficulty of the conductive connection elements 800.

In the embodiment, a display device 10 includes the circuit substrate 100, the first LEDs 300, the anisotropic conductive adhesive structures 212, and the conductive connection elements 800. In some embodiments, since the display device 10 includes the plurality of anisotropic conductive adhesive structures 212 that are separated from each other, a transmissive region that does not include the anisotropic conductive adhesive structures 212 may be set in the display device 10 to make the display device 10 to be a transparent display device. Compared with forming an anisotropic conductive film on the entire surface of the circuit substrate 100, an area of the transmissive region of the transparent display device may be increased by forming the plurality of anisotropic conductive adhesive structures 212 separated from each other.

Figure 2B:
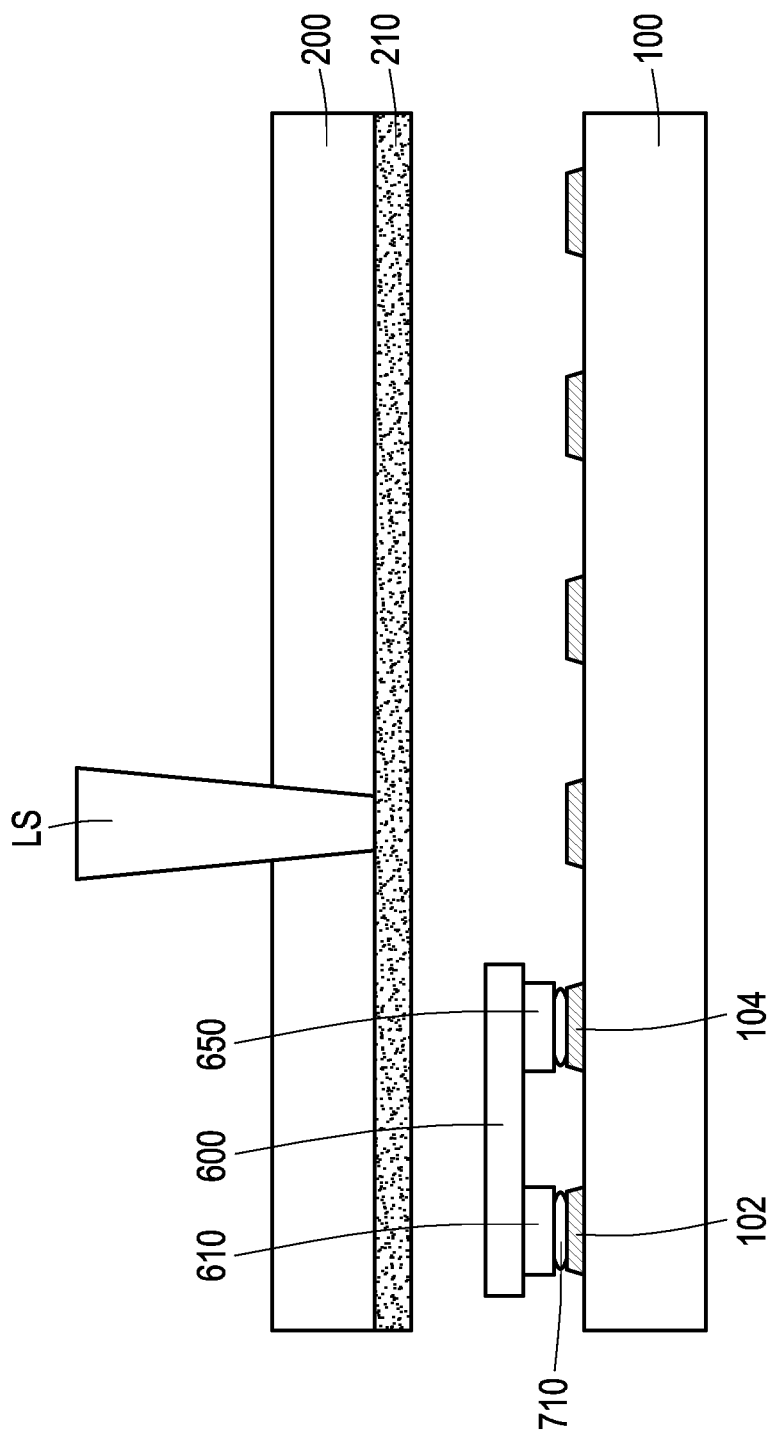

FIG. 2A to FIG. 2G are schematic cross-sectional views of a manufacturing method of a display device according to an embodiment of the disclosure. It should be noted that the embodiment of FIG. 2A to FIG. 2G continues to use the component numbers and a part of the content of the embodiment of FIG. 1A to FIG. 1G, where the same reference numbers denote the same or like components, and descriptions of the same technical contents are omitted. The aforementioned embodiment may be referred for descriptions of the omitted parts, and detailed descriptions thereof are not repeated in the following embodiment. Referring to FIG. 2A, a second LED 600 is bonded to the circuit substrate 100 through a solder layer 710. In the embodiment, the second LED 600 is a flip chip LED, which has a first electrode 610 and a second electrode 650 located on a same side of the second LED 600. The first electrode 610 of the second LED 600 is connected to the first pad 102 through the solder layer 710, and the second electrode 650 is connected to the second pad 104 through the solder layer 710. In some embodiments, a melting point of the solder layer 710 is higher than 180 degrees Celsius, thereby avoiding a possibility of melting the solder layer 710 in subsequent processes.

Figure 2C:
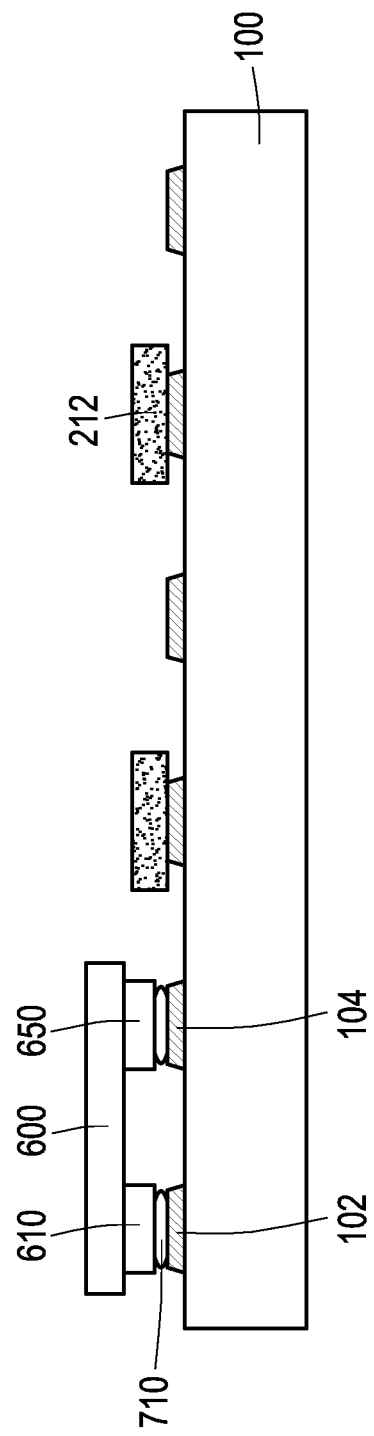

Referring to FIG. 2B to FIG. 2C, the plurality of anisotropic conductive adhesive structures 212 separated from each other are placed above the circuit substrate 100. For example, the anisotropic conductive adhesive material layer 210 is first attached to the entire surface of the carrier board 200, as shown in FIG. 1A. Then, referring to FIG. 2B, the carrier board 200 and the anisotropic conductive adhesive material layer 210 are moved to the above of the circuit substrate 100, and the laser LS is used to irradiate a portion of the anisotropic conductive adhesive material layer 210. After irradiating the laser LS, a portion of the anisotropic conductive adhesive material layer 210 is transferred onto the circuit substrate 100 to form the anisotropic conductive adhesive structures 212, as shown in FIG. 2B to FIG. 2C.

In the embodiment, the anisotropic conductive adhesive structures 212 are formed on the first pads 102 that are not bonded to the second LED 600.

Figure 2D:
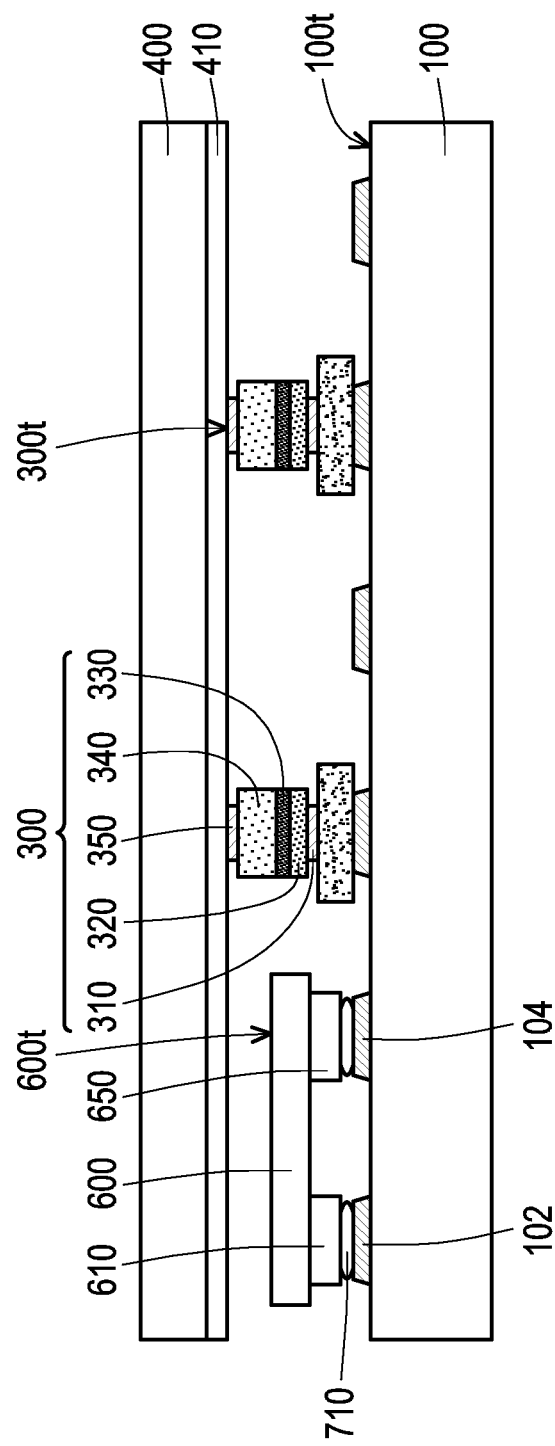

Referring to FIG. 2D, a plurality of first light-emitting diodes 300 are disposed above the circuit substrate 100, where the anisotropic conductive adhesive structures 212 are located between the circuit substrate 100 and the first LEDs 300.

For example, the transfer substrate 400 is used to transfer the first LEDs 300 onto the circuit substrate 100, and the anisotropic conductive adhesive structures 212 are adhered to the first LEDs 300. An adhesive force between the first LEDs 300 and the anisotropic conductive adhesive structures 212 is greater than an adhesive force between the first LEDs 300 and the adhesive layer 410. Therefore, after the transfer substrate 400 is removed, the first LEDs 300 may remain on the anisotropic conductive adhesive structures 212, wherein each anisotropic conductive adhesive structure 212 is located between the circuit substrate 100 and the corresponding first LED 300.

In some embodiments, taking the top surface 100t of the circuit substrate 100 as reference, a height of a top surface 300t of the first LED 300 is greater than a height of a top surface 600t of the second LED 600. Therefore, when the first LEDs 300 are transferred, the adhesive layer 410 will not contact the second LED 600.

Figure 2E:
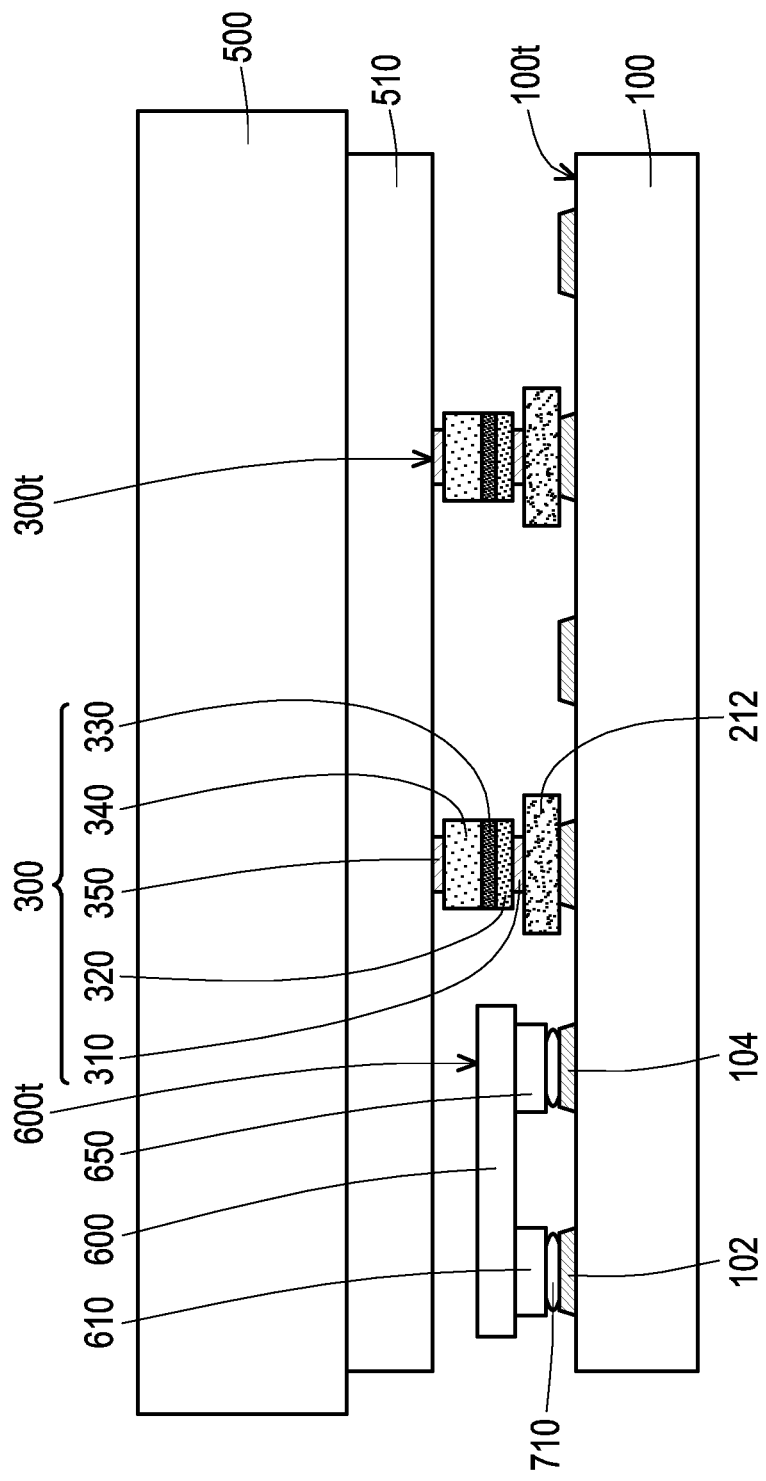
Figure 2F:
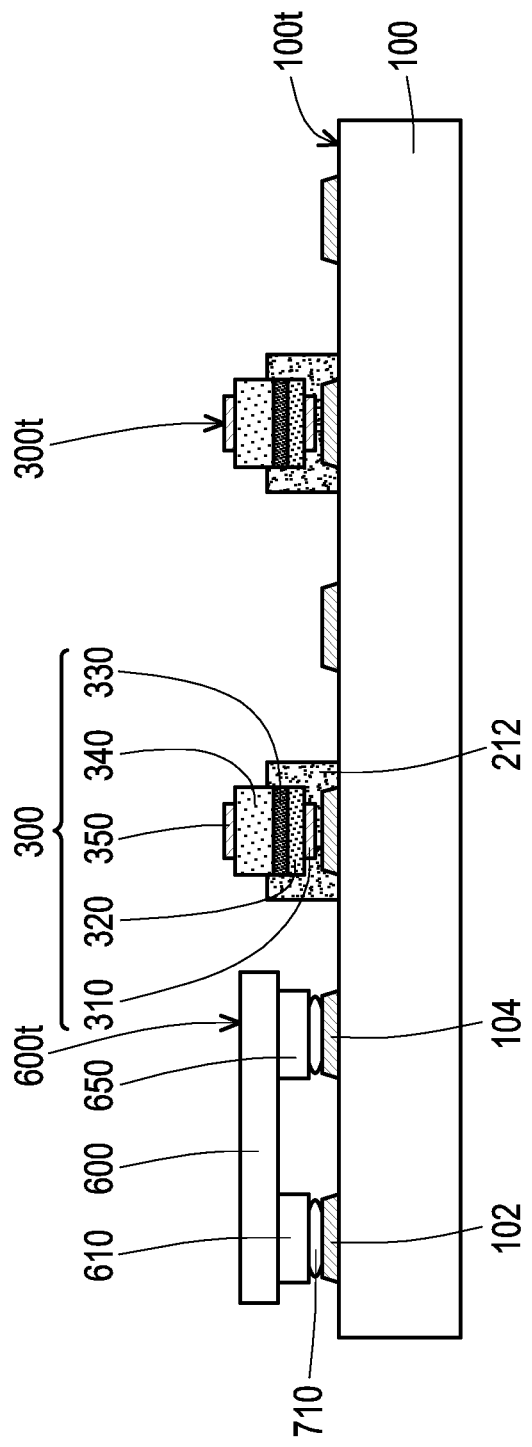

Then, referring to FIG. 2E to FIG. 2F, the first LEDs 300 are pressurized to make the first LEDs 300 to trap into the anisotropic conductive adhesive structures 212. For example, the pressurizing member 500 is used to pressurize the plurality of first LEDs 300 at the same time. In some embodiments, the surface of the pressurizing member 500 includes the buffer layer 510, and the buffer layer 510 contacts the plurality of first LEDs 300 at the same time. In some embodiments, after the first LEDs 300 are pressurized, taking the top surface 100t of the circuit substrate 100 as reference, the height of the top surface 300t of the first LED 300 is greater than or equal to the height of the top surface 600t of the second LED 600. In other embodiments, the pressurizing member 500 and the buffer layer 510 may be kept away from the position where the second LED 600 is arranged. In this case, after the first LEDs 300 are pressurized, the height of the top surface 300t of the first LED 300 may be lower than the height of the top surface 600t of the second LED 600.

Figure 2G:
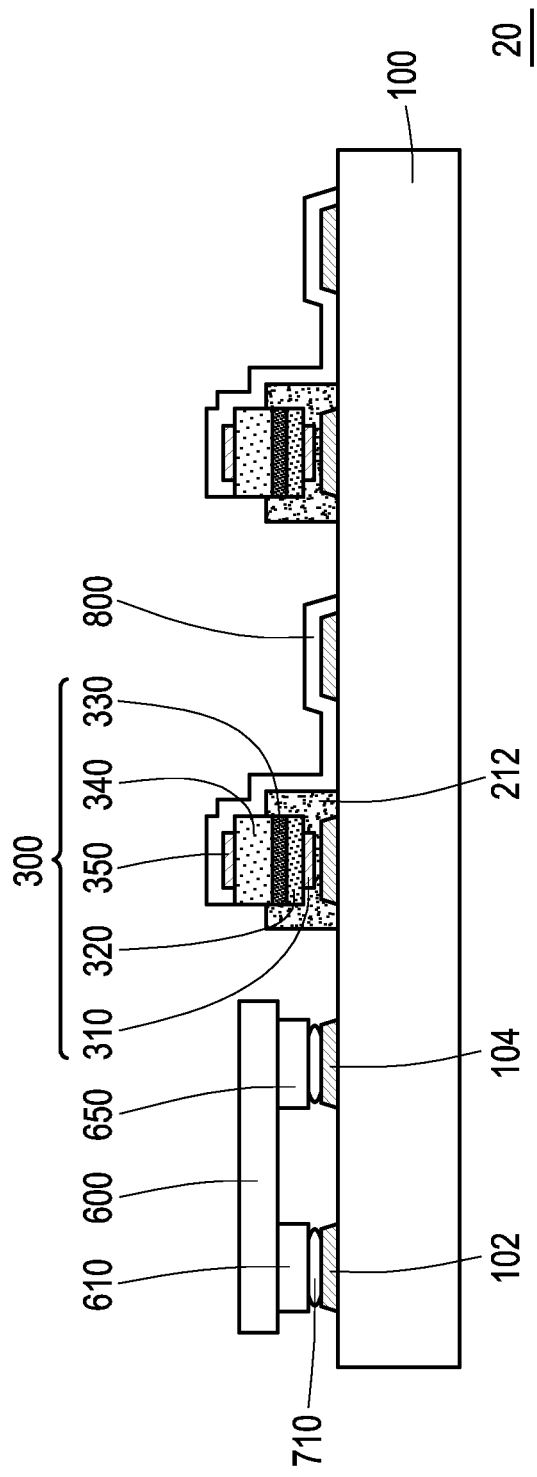

Finally, referring to FIG. 2G, the plurality of conductive connection elements 800 are formed on the upper electrode 350 of the first LEDs 300, the anisotropic conductive adhesive structures 212 and the second pads 104 of the circuit substrate 100. A portion of the conductive connection element 800 is located on the anisotropic conductive adhesive structure 212. The conductive connection element 800 electrically connects the upper electrode 350 of the first LED 300 to the second pad 104 of the circuit substrate 100. The conductive connection element 800 is in contact with the upper electrode 350, the second semiconductor layer 340, and the second pad 104, and a portion of the anisotropic conductive adhesive structure 212 is sandwiched between the conductive connection element 800 and the light-emitting layer 330, between the conductive connection element 800 and the first semiconductor layer 320, between the conductive connection element 800 and the lower electrode 310, and between the conductive connecting element 800 and the first pad 102. In some embodiments, the conductive connection element 800 includes metal, metal oxide (for example, indium tin oxide), metal nitride, or other suitable materials.

In the embodiment, the anisotropic conductive adhesive structure 212 may be used as a step to prevent the conductive connection element 800 from breaking due to an excessive step difference between the upper electrode 350 and the second pad 104, thereby reducing the manufacturing difficulty of the conductive connection elements 800.

In the embodiment, a display device 20 includes the circuit substrate 100, the first LEDs 300, the anisotropic conductive adhesive structures 212, the conductive connection elements 800, the second LED 600 and the solder layer 710. In some embodiments, since the display device 20 includes the plurality of anisotropic conductive adhesive structures 212 that are separated from each other, a transmissive region that does not include the anisotropic conductive adhesive structures 212 may be set in the display device 20 to make the display device 20 to be a transparent display device. Compared with forming an anisotropic conductive film on the entire surface of the circuit substrate 100, an area of the transmissive region of the transparent display device may be increased by forming the plurality of anisotropic conductive adhesive structures 212 separated from each other. In some embodiments, the second LED 600 is a red LED, and the red LED with a flip-chip structure has better red luminous efficiency than the red LED with a vertical structure. Therefore, the red LED in the display device 20 adopts a flip-chip structure to improve the red luminous efficiency of the display device 20.

Figure 3:
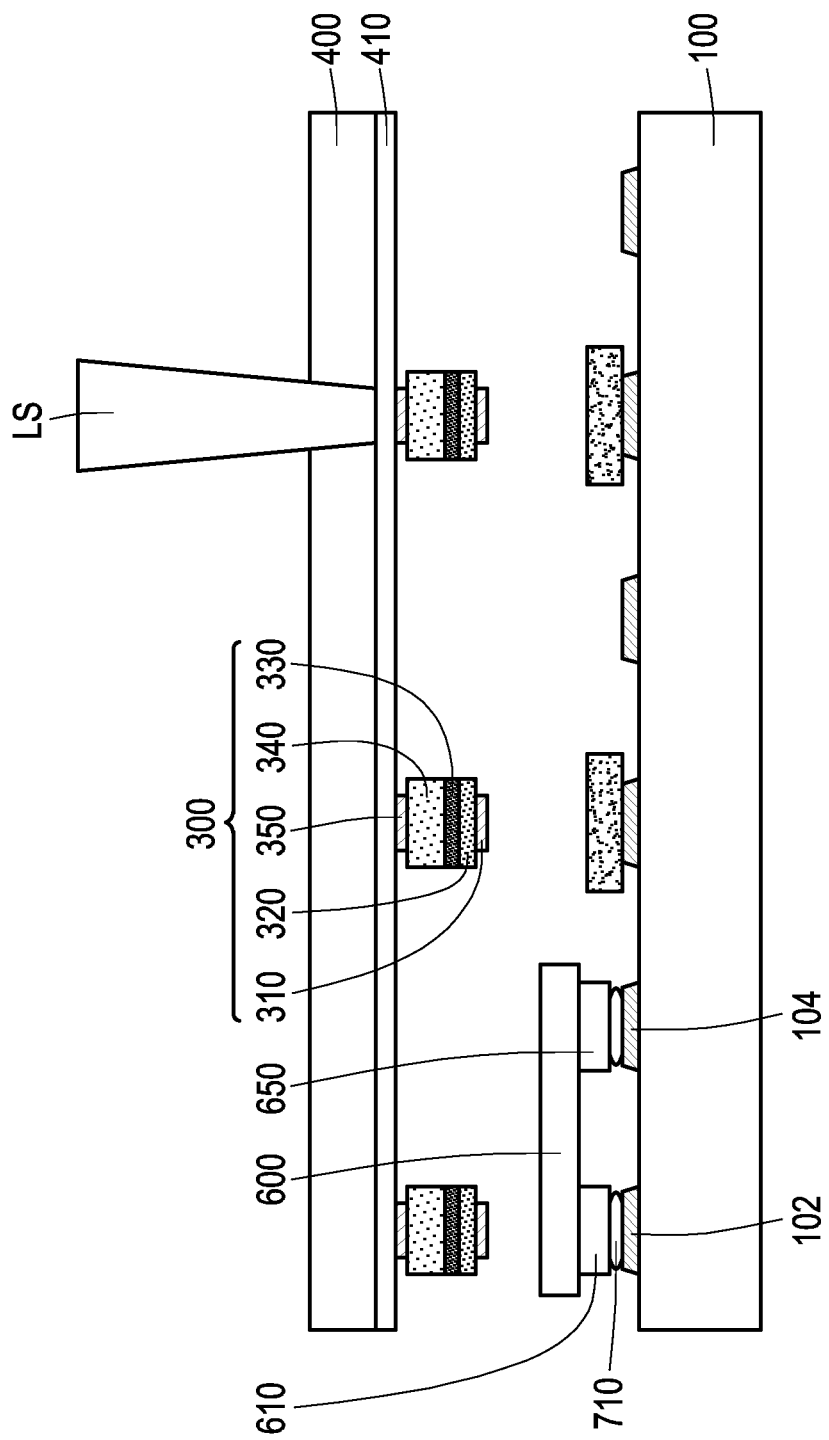
FIG. 3 is a schematic cross-sectional view of a manufacturing method of a display device according to an embodiment of the disclosure.

FIG. 3 is a schematic cross-sectional view of a manufacturing method of a display device according to an embodiment of the disclosure. It should be noted that the embodiment in FIG. 3 continues to use the component numbers and a part of the content of the embodiment of FIG. 2A to FIG. 2G, where the same reference numbers denote the same or like components, and descriptions of the same technical contents are omitted. The aforementioned embodiment may be referred for descriptions of the omitted parts, and detailed descriptions thereof are not repeated in the following embodiment.

Referring to FIG. 3, in the embodiment, disposing the first LEDs 300 above the circuit substrate 100 includes laser transfer. Specifically, the laser LS is used to irradiate the adhesive layer 410, so that the specific first LEDs 300 leaves the transfer substrate 400 and falls onto the anisotropic conductive adhesive structures 212. For subsequent steps, reference may be made to related descriptions of FIG. 2E to FIG. 2G.

Figure 4:
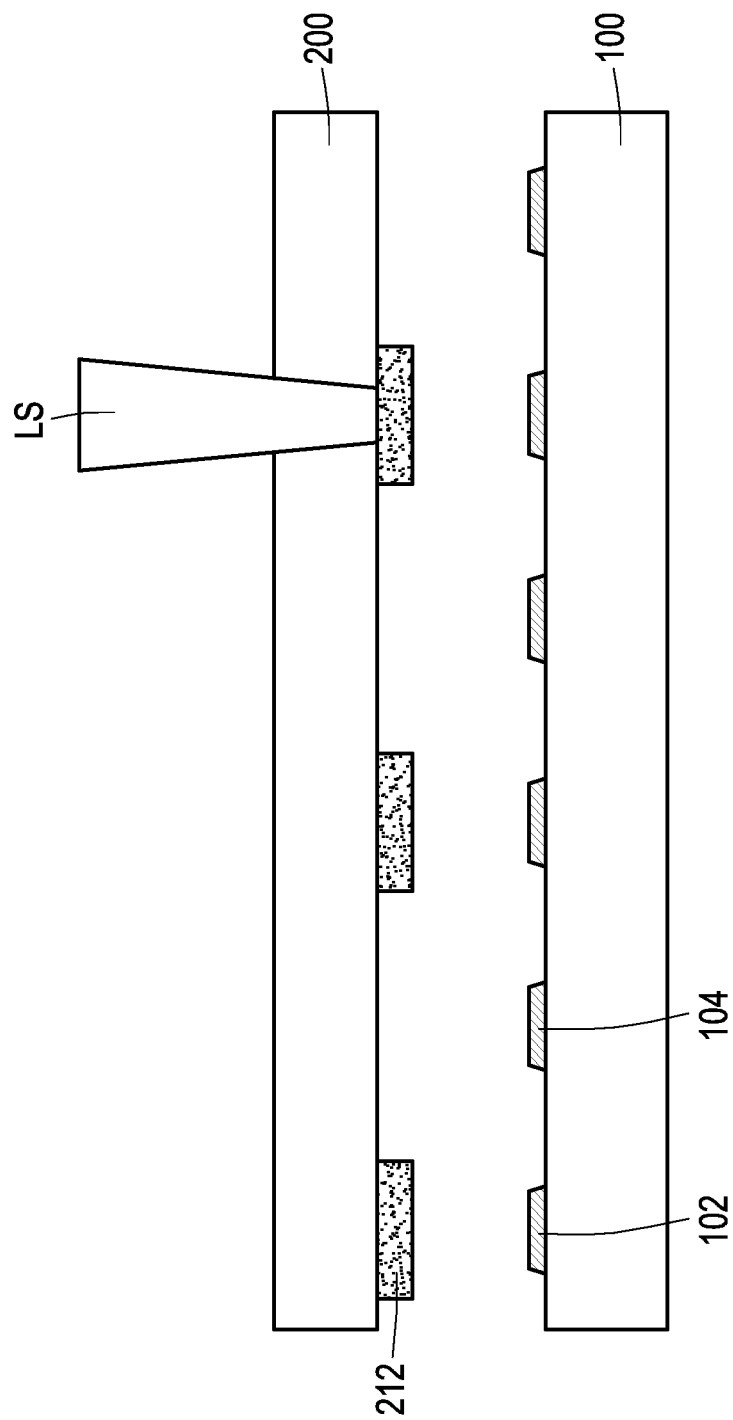
FIG. 4 is a schematic cross-sectional view of a manufacturing method of a display device according to an embodiment of the disclosure.

FIG. 4 is a schematic cross-sectional view of a manufacturing method of a display device according to an embodiment of the disclosure. It should be noted that the embodiment in FIG. 4 continues to use the component numbers and a part of the content of the embodiment of FIG. 1A to FIG. 1G, where the same reference numbers denote the same or like components, and descriptions of the same technical contents are omitted. The aforementioned embodiment may be referred for descriptions of the omitted parts, and detailed descriptions thereof are not repeated in the following embodiment.

Referring to FIG. 4, in the embodiment, placing the anisotropic conductive adhesive structures 212 above the circuit substrate 100 includes following steps. First, the plurality of anisotropic conductive adhesive structures 212 separated from each other are formed on the carrier board 200. Then, the anisotropic conductive adhesive structures 212 on the carrier board 200 is separated from the carrier board 200 by the laser L S, and falls onto the first pads 102 of the circuit substrate 100. In the embodiment, the anisotropic conductive adhesive structures 212 are removed from the carrier board 200 by the laser LS, but the disclosure is not limited thereto. In other embodiments, the carrier board 200 is directly pressed against the circuit substrate 100, and the plurality of anisotropic conductive adhesive structures 212 on the carrier board 200 are adhered to the plurality of first pads 102 of the circuit substrate 100.

Figure 5:
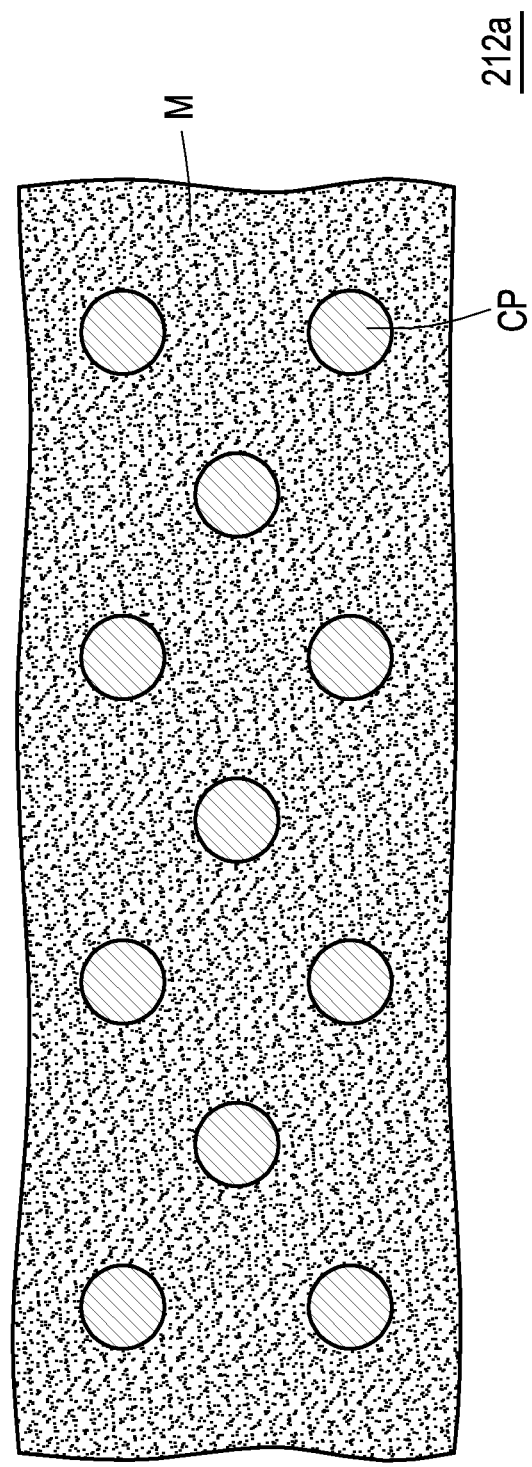
FIG. 5 is a schematic cross-sectional view of an anisotropic conductive adhesive structure before pressurization according to an embodiment of the disclosure.

FIG. 5 is a schematic cross-sectional view of an anisotropic conductive adhesive structure before pressurization according to an embodiment of the disclosure. Referring to FIG. 5, an anisotropic conductive adhesive structure 212a includes a base material M and a plurality of conductive particles CP dispersed in the base material M. Before the anisotropic conductive adhesive structure 212a is pressurized (i.e., before pressurizing the first LED (referring to FIG. 1C and FIG. 2C)), the conductive particles CP are arrayed in the base material M, and the conductive particles CP do not form a conductive path. After the anisotropic conductive adhesive structure 212a is pressurized (i.e., after pressurizing the first LED (referring to FIG. 1F and FIG. 2F)), the conductive particles CP in a pressurized direction may contact each other to form a conductive path in the pressurized direction.

Figure 6:
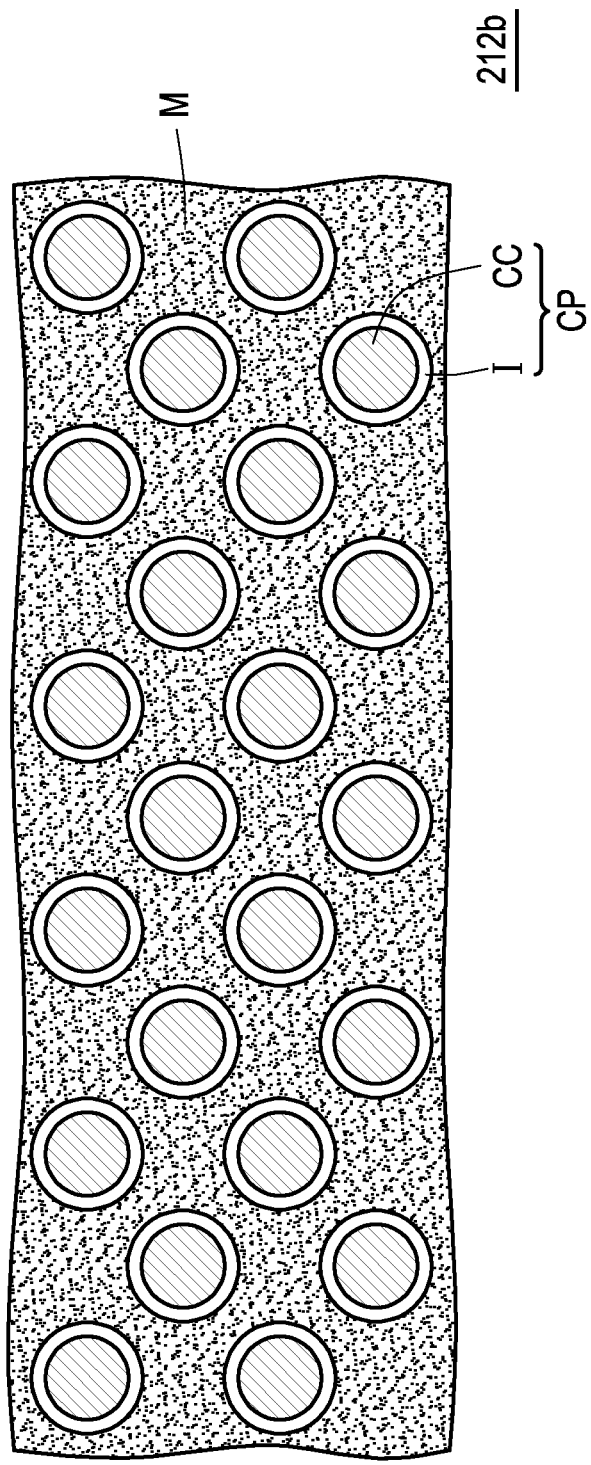
FIG. 6 is a schematic cross-sectional view of an anisotropic conductive adhesive structure before pressurization according to an embodiment of the disclosure.

FIG. 6 is a schematic cross-sectional view of an anisotropic conductive adhesive structure before pressurization according to an embodiment of the disclosure. Referring to FIG. 6, an anisotropic conductive adhesive structure 212b includes a base material M and a plurality of conductive particles CP dispersed in the base material M. In the embodiment, the conductive particle CP includes a conductive core CC and an insulating layer I, where the insulating layer I is located on a surface of the conductive core CC. The insulating layer I may be used to avoid the possibility of generating an unexpected conductive path by the anisotropic conductive adhesive structure 212b. Before the anisotropic conductive adhesive structure 212b is pressurized (i.e., before pressuring the first LED (referring to FIG. 1C and FIG. 2C)), the insulating layer I wraps the conductive core CC, so that even if the conductive particles CP are in contact with each other, the conductive cores CC are not easily communicated with each other to form a conductive path. After the anisotropic conductive adhesive structure 212b is pressurized (i.e., after pressuring the first LED (referring to FIG. 1F and FIG. 2F)), the conductive particles CP in the pressurized direction may contact each other, and the insulating layers I are broken under pressure to form the conductive cores CC connected to each other to form a conductive path in the pressurized direction.

In summary, the first LEDs of the disclosure are electrically connected to the circuit substrate through the anisotropic conductive adhesive structures, thereby reducing the probability of falling-off of the LEDs. In addition, by forming the conductive connection elements on the anisotropic conductive adhesive structures, the risk of breaking of the conductive connection elements due to excessive step difference may be reduced, thereby reducing the difficulty of manufacturing the conductive connection elements.

What is claimed is:
1. A display device, comprising:
a circuit substrate;
a first light-emitting diode, located above the circuit substrate;
an anisotropic conductive adhesive structure, located between the circuit substrate and the first light-emitting diode, and electrically connecting the circuit substrate to a lower electrode of the first light-emitting diode, wherein, taking a top surface of the circuit substrate as reference, a height of a top surface of the anisotropic conductive adhesive structure is greater than or equal to a height of a top surface of a light-emitting layer of the first light-emitting diode, and the height of the top surface of the anisotropic conductive adhesive structure is lower than a height of an upper electrode of the first light-emitting diode, wherein the anisotropic conduc- tive adhesive structure comprises a base material and a plurality of conductive particles dispersed in the base material; and a conductive connection element, electrically connecting the upper electrode of the first light-emitting diode to the circuit substrate, wherein a portion of the conductive connection element is located on the anisotropic conductive adhesive structure.

2. The display device according to claim 1, wherein the anisotropic conductive adhesive structure comprises a carbon black material.

3. The display device according to claim 1, wherein each of the conductive particles comprises:
a conductive core; and
an insulating layer, located on a surface of the conductive core.

4. The display device according to claim 1, further comprising:
a second light-emitting diode, located above the circuit substrate, and electrically connected to the circuit substrate through a solder layer, wherein a melting point of the solder layer is higher than 180 degrees Celsius.

5. The display device according to claim 4, wherein the first light-emitting diode is a vertical light-emitting diode, and the second light-emitting diode is a flip chip light-emitting diode.

6. The display device according to claim 4, wherein taking the top surface of the circuit substrate as reference, a height of a top surface of the first light-emitting diode is lower than or equal to a height of a top surface of the second light-emitting diode.

7. The display device according to claim 1, further comprising:
a plurality of first light-emitting diodes, located above the circuit substrate;
a plurality of anisotropic conductive adhesive structures, located between the circuit substrate and the first light-emitting diodes, each of the anisotropic conductive adhesive structures electrically connecting the circuit substrate to the corresponding first light-emitting diode, wherein the anisotropic conductive adhesive structures are separated from each other; and
a plurality of conductive connection elements, wherein each of the conductive connection elements electrically connects the corresponding first light-emitting diode to the circuit substrate.

8. The display device according to claim 1, wherein the first light-emitting diode comprises the lower electrode, a first semiconductor layer, the light-emitting layer, a second semiconductor layer, and the upper electrode stacked in sequence, wherein the anisotropic conductive adhesive structure covers a sidewall of the first semiconductor layer.

9. The display device according to claim 8, wherein the conductive connection element contacts the upper electrode and the second semiconductor layer.

10. A manufacturing method of a display device, comprising:
placing an anisotropic conductive adhesive structure above a circuit substrate, wherein the anisotropic conductive adhesive structure comprises a base material and a plurality of conductive particles dispersed in the base material;
disposing a first light-emitting diode above the circuit substrate, wherein the anisotropic conductive adhesive structure is located between the circuit substrate and the first light-emitting diode;

pressurizing the first light-emitting diode so that the first light-emitting diode is trapped into the anisotropic conductive adhesive structure, wherein, taking a top surface of the circuit substrate as reference, a height of a top surface of the anisotropic conductive adhesive structure is greater than or equal to a height of a top surface of a light-emitting layer of the first light-emitting diode, and the height of the top surface of the anisotropic conductive adhesive structure is lower than a height of an upper electrode of the first light-emitting diode, wherein the anisotropic conductive adhesive structure electrically connects the circuit substrate to a lower electrode of the first light-emitting diode; and forming a conductive connection element on the upper electrode of the first light-emitting diode, the anisotropic conductive adhesive structure, and the circuit substrate, wherein the conductive connection element electrically connects the upper electrode of the first light-emitting diode to the circuit substrate, and a portion of the conductive connection element is located on the anisotropic conductive adhesive structure.

11. The manufacturing method according to claim 10, wherein, before the first light-emitting diode is pressurized, a thickness of the anisotropic conductive adhesive structure is greater than a thickness of the lower electrode of the first light-emitting diode, and a width of the anisotropic conductive adhesive structure is greater than a width of the first light-emitting diode.

12. The manufacturing method according to claim 10, wherein
the conductive particles are arrayed in the base material before the first light-emitting diode is pressurized.

13. The manufacturing method according to claim 10, wherein placing the anisotropic conductive adhesive structure above the circuit substrate comprises:
adhering an anisotropic conductive adhesive material layer on an entire surface of a carrier board;
moving the carrier board and the anisotropic conductive adhesive material layer to the above of the circuit substrate; and
irradiating a portion of the anisotropic conductive adhesive material layer by laser to transfer a portion of the anisotropic conductive adhesive material layer onto the circuit substrate to form the anisotropic conductive adhesive structure.

14. The manufacturing method according to claim 10, wherein, before placing the anisotropic conductive adhesive structure above the circuit substrate, the manufacturing method further comprises:
bonding a second light-emitting diode to the circuit substrate through a solder layer, wherein a melting point of the solder layer is higher than 180 degrees Celsius.

15. The manufacturing method according to claim 14, wherein the first light-emitting diode is a vertical light-emitting diode, and the second light-emitting diode is a flip chip light-emitting diode.

16. The manufacturing method according to claim 10, further comprising:
placing a plurality of anisotropic conductive adhesive structures above the circuit substrate;
disposing a plurality of first light-emitting diodes above the circuit substrate, wherein each of the anisotropic conductive adhesive structures is located between the circuit substrate and the corresponding first light-emitting diode;

pressurizing the first light-emitting diodes so that the first light-emitting diodes are trapped into the anisotropic conductive adhesive structures; and forming a plurality of conductive connection elements on the first light-emitting diodes, the anisotropic conductive adhesive structures, and the circuit substrate, wherein each of the conductive connection elements electrically connects the corresponding first light-emitting diode to the circuit substrate.

17. The manufacturing method according to claim 16, wherein pressurizing the first light-emitting diodes comprises:

pressurizing the first light-emitting diodes at the same time by a pressurizing member.

18. A display device, comprising:

a circuit substrate;

a first light-emitting diode, located above the circuit substrate;

an anisotropic conductive adhesive structure, located between the circuit substrate and the first light-emitting diode, and electrically connecting the circuit substrate to a lower electrode of the first light-emitting diode, wherein, taking a top surface of the circuit substrate as reference, a height of a top surface of the anisotropic conductive adhesive structure is greater than or equal to a height of a top surface of a light-emitting layer of the first light-emitting diode, and the height of the top surface of the anisotropic conductive adhesive structure is lower than a height of an upper electrode of the first light-emitting diode;

a second light-emitting diode, located above the circuit substrate, and electrically connected to the circuit substrate through a solder layer, wherein a melting point of the solder layer is higher than 180 degrees Celsius, the first light-emitting diode is a vertical light-emitting diode, and the second light-emitting diode is a flip chip light-emitting diode; and a conductive connection element, electrically connecting the upper electrode of the first light-emitting diode to the circuit substrate, wherein a portion of the conductive connection element is located on the anisotropic conductive adhesive structure.

* * * * *